(12) United States Patent
Shirali

(10) Patent No.: US 7,085,330 B1
(45) Date of Patent: Aug. 1, 2006

(54) METHOD AND APPARATUS FOR AMPLIFIER LINEARIZATION USING ADAPTIVE PREDISTORTION

(75) Inventor: Kedar Shirali, Sunnyvale, CA (US)

(73) Assignee: Marvell International Ltd., Hamilton (BM)

(*) Notice: Subject to any disclaimer, the term of this patent is extended or adjusted under 35 U.S.C. 154(b) by 809 days.

(21) Appl. No.: 10/153,554

(22) Filed: May 22, 2002

Related U.S. Application Data

(60) Provisional application No. 60/357,317, filed on Feb. 15, 2002.

(51) Int. Cl.
*H04L 25/03* (2006.01)

(52) U.S. Cl. ............... 375/296; 375/297; 455/50.1; 455/63; 455/115; 455/126

(58) Field of Classification Search ............. 375/285, 375/295–297; 455/50.1, 63, 67.1, 67.3, 115, 455/120, 125, 126
See application file for complete search history.

(56) References Cited

U.S. PATENT DOCUMENTS

| | | | |
|---|---|---|---|
| 4,291,277 A | 9/1981 | Davis et al. | |
| 4,967,164 A | 10/1990 | Sari | |
| 5,049,832 A | 9/1991 | Cavers | |
| 5,107,520 A | 4/1992 | Karam et al. | |
| 5,148,448 A | 9/1992 | Karam et al. | |
| 5,253,272 A | 10/1993 | Jaeger et al. | |
| 5,486,789 A | 1/1996 | Palandech et al. | |
| 5,760,646 A | 6/1998 | Belcher et al. | |
| 5,892,397 A | 4/1999 | Belcher et al. | |
| 5,900,778 A | 5/1999 | Stonick et al. | |

(Continued)

FOREIGN PATENT DOCUMENTS

EP    0 387 948 A1    9/1990

(Continued)

OTHER PUBLICATIONS

Sundstrom, Lars, et al., Effects of Reconstruction Filters In Digital Predistortion Linearizers for RF Power Amplifiers, IEEE Transactions on Vehicular Technology, Feb. 1995, pp. 131-139, vol. 44, No. 1, IEEE, US.

(Continued)

*Primary Examiner*—Dac V. Ha

(57) ABSTRACT

A signal processing method and apparatus capable of correcting signal distortion introduced by an RF power amplifier is disclosed, which includes the use of a buffer to store a plurality of samples representing at least a portion of an input signal intended for amplification by the RF power amplifier, the use of a self-receiver to receive an output signal generated by the RF power amplifier, the use of a synchronization unit to determine, as a matching input sample, which of the stored plurality of samples corresponds most closely to the output signal, and the use of a predistortion unit to selectively apply a distortion correction function to the input signal prior to amplification by the RF power amplifier in which the distortion correction function being derived from a relationship between the matching input sample and the output signal. This permits more precise and updateable determination of the delays involved in the RF modulation and amplification stages of the amplifier and the self-receiver, thus allowing for more precise and aggressive adaptive predistortion to be used. A phase offset correction is optionally provided to correct a phase offset in the realized sample of the output signal relative to the matching input symbol. Additionally, a sampling phase error correction unit may be provided to generate sampling alteration information to an analog-to-digital converter to cause such analog-to-digital converter to selectively alter sampling of the output signal.

58 Claims, 6 Drawing Sheets

U.S. PATENT DOCUMENTS

| | | | |
|---|---|---|---|
| 5,910,965 | A | 6/1999 | Ierfino |
| 5,929,703 | A | 7/1999 | Sehier et al. |
| 6,075,411 | A | 6/2000 | Briffa et al. |
| 6,078,216 | A | 6/2000 | Proctor, Jr. |
| 6,108,385 | A | 8/2000 | Worley, III |
| 6,118,335 | A | 9/2000 | Nielsen et al. |
| 6,236,837 | B1 | 5/2001 | Midya |
| 6,240,278 | B1 | 5/2001 | Midya et al. |
| 6,252,912 | B1 | 6/2001 | Salinger |
| 6,275,685 | B1 * | 8/2001 | Wessel et al. ............... 455/126 |
| RE37,407 | E | 10/2001 | Eisenberg et al. |
| 6,298,096 | B1 | 10/2001 | Burgin |
| 6,298,097 | B1 | 10/2001 | Shalom |
| 6,320,463 | B1 | 11/2001 | Leva et al. |
| 6,836,517 | B1 * | 12/2004 | Nagatani et al. ............ 375/296 |
| 2001/0004223 | A1 | 6/2001 | Kim |

FOREIGN PATENT DOCUMENTS

| | | |
|---|---|---|
| EP | 0 380 167 B1 | 8/1994 |
| EP | 0 387 948 B1 | 8/1994 |
| WO | WO 98/04034 A1 | 1/1998 |
| WO | WO 98/28888 A1 | 7/1998 |
| WO | WO 00/01065 A1 | 1/2000 |
| WO | WO 02/15389 A1 | 2/2002 |

OTHER PUBLICATIONS

Sundstrom, Lars, et al., Quantization Analysis and Design of a Digital Predistortion Linearizer for RF Power Amplifiers, IEEE Transactions on Vehicular Technology, Nov. 1996, pp. 707-719, vol. 45, No. 4, IEEE, US.

Cavers, James K., The Effect of Quadrature Modulator and Demodulator Errors on Adaptive Digital Presidtorters for Amplifier Linearization, IEEE Transactions on Vehicular Technology, May 1997, pp. 456-466, vol. 46, No. 2, IEEE, US.

Faulkner, Michael, et al., Adaptive Linearization Using Predistortion—Experimental Results, IEEE Transactions on Vehicular Technology, May 1994, pp. 323-332, vol. 43, No. 2, IEEE, US.

Zavosh, Frank, et al., Digital Predistortion Techniques for RF Power Amplifiers with CDMA Applications, Microwave Journal, Oct. 1999, Horizon House Publications, US.

Andreani, P., et al., Chip for Wideband Digital Predistorion RF Power Amplifier Linearisation, Electronics Letters, May 22, 1997, pp. 925-926, vol. 33, No. 11, IEE, UK.

D'Andrea, Aldo N., et al., a Digital Approach to Efficient RF Power Amplifier Linearization, Proc. of IEEE GlobeCOMM '97, 1997, pp. 77-81, IEEE, US.

Johnson, Daniel Eric, Adaptive Digital Predistortion with Applications for LMDS Systems, Aug. 25, 2000, Virginia Polytechnic Institute and State University, US.

ANSI/IEEE, Std. 802.11, 1999 Edition, Part 11: Wireless LAN Medium Access Control (MAC) and Physical Layer (PHY) Specifications, Aug. 20, 1999, IEEE, US.

* cited by examiner

METHOD AND APPARATUS FOR AMPLIFIER LINEARIZATION USING ADAPTIVE PREDISTORTION

CROSS-REFERENCE TO RELATED APPLICATIONS

This application claims the benefit of U.S. Provisional Application No. 60/357,317, filed on Feb. 15, 2002. The disclosure of the above application is incorporated herein by reference in its entirety.

TECHNICAL FIELD

This invention relates to wireless communications, and is particularly concerned with improving amplifier linearization using adaptive predistortion techniques.

BACKGROUND OF THE INVENTION

The past few years has witnessed the ever-increasing availability of relatively cheap, low power wireless data communication services, networks and devices, promising near wire speed transmission and reliability. One technology in particular, described in the IEEE Standard 802.11a (1999) and Draft IEEE Standard 802.11g (2002) High Rate PHY Supplements to the ANSI/IEEE Standard 802.11, 1999 edition, collectively incorporated herein fully by reference, has recently been commercialized with the promise of 54 Mbps effective bandwidth in the less crowded 5 GHz band, making it a strong competitor to traditional wired Ethernet and the more ubiquitous "802.11b" or "WiFi" 11 Mbps wireless transmission standard.

IEEE 802.11a and 802.11g compliant transmission systems achieve their high data transmission rates using OFDM encoded symbols mapped up to 64 QAM multicarrier constellation. Before final power amplification and transmission, the multicarrier OFDM symbol encoded symbols are converted into the time domain using Inverse Fast Fourier Transform techniques resulting in a relatively high-speed time domain signal with a large peak-to-average ratio (PAR).

The large PAR characteristic of this transmission signal makes it difficult to use sub-class A RF power amplification without significant back-off due to nonlinear effects of such power amplifiers, which reduces generated signal strength, effective range, and, ultimately utility as a wireless transmission system. Class A amplifiers are too power inefficient market for mobile users where wireless transmission has the highest penetration, so ways to extend the linear response of more power efficient sub Class A power amplifiers are currently being explored.

Known techniques to extend the nonlinear performance of sub Class A amplifiers when faced with amplifying high-speed, high PAR signals include digitally clipping and otherwise compressing the PAR values of such signals. This brings up the effective transmission gain up 2–3 db typical since PAR is compressed, but still does not provide sufficient extended range over non-implementing systems and can indirectly reduce effective throughput in IEEE 802.11a & 802.11g compliant systems, because such systems will reduce transmission rates in an effort to compensate for reception errors in fringe reception environments.

Therefore, the wireless industry has turned to adaptive predistortion in an attempt to actually extend the linear gain and phase response of power efficient Class AB and other designs. Known adaptive predistortion techniques compare the output of the power amplifier against the input signal to determine e.g. gain and phase nonlinearities between the two, create an predistortion correction function to process the input signal to counteract those nonlinearities when they are experienced. Typically, a predistorter using a signal processor, lookup table, or a combination thereof interposes the input and the amplifier to implement the adaptive predistortion.

One obstacle to implementing a successful predistortion design with respect to high-speed, high-PAR signal transmission as required by the IEEE 802.11a &g physical layer standards has been the issue of accounting for the delay it takes to self-receive the output of the power amplifier after a given input signal has been fed to the predistorter. Note here that in order for adaptive predistortion to be successful, it is important that the output signal at the power amplifier be compared to its corresponding input signal to great temporal precision. Accounting for this delay still appears to be a black art fraught with trial-and-error, since it appears that designers simply approximate the delay from the input to the predistorter to the output of the self-receiver based on implementing component delays and then verifying and tweaking their designs through trial-and-error until the experienced delay is found and accommodated. Further, this design approach appears to disregard or minimize the importance of changing power levels and frequencies of the input signal which may alter the self-receive delays, as well as other potential delay altering issues, such as component aging, environmental effects, and interference.

SUMMARY OF THE INVENTION

To address these and related problems, the present invention is directed to a signal processing method and apparatus capable of correcting signal distortion introduced by an RF power amplifier, which includes the use of a buffer to store a plurality of samples representing at least a portion of an input signal intended for amplification by the RF power amplifier, the use of a self-receiver to receive an output signal generated by the RF power amplifier, the use of a synchronization unit to determine, as a matching input sample, which of the stored plurality of samples corresponds most closely to the output signal, and the use of a predistortion unit to selectively apply a distortion correction function to the input signal prior to amplification by the RF power amplifier in which the distortion correction function being derived from a relationship between the matching input sample and the output signal.

In accordance with a disclosed embodiment of the invention, the self-receiver may include an analog-to-digital converter to realize a sample of the output signal. Moreover, the synchronization unit may include a correlation unit which correlates a characteristic, such as a magnitude, for each of the stored samples against a similar characteristic of the realized sample of the output signal.

Consistent with an aspect of the invention, a phase offset correction unit can be provided to correct a phase offset in the realized sample of the output signal relative to the matching input symbol; and the predistortion unit can be arranged to include an adaptation unit to derive the distortion correction function based on a relationship between the matching input sample and the phase offset corrected realized sample of the output signal.

Consistent with another aspect, a sampling phase error correction unit may be provided to generate sampling alteration information to the analog-to-digital converter to cause this analog-to-digital converter to selectively alter sampling of the output signal. In this aspect, the correlation unit may used to generate a first correlation result for one of stored samples immediately preceding the matching input sample in the buffer, as well as to generate a second correlation result for one of the stored samples immediately proceeding the matching input sample in this buffer. In such case, the sampling phase error correction unit may generate the sampling alteration information based on a relationship between these first and second correlation results.

Consistent with yet an additional aspect of the invention, the aforementioned synchronization unit may include a convergence determination unit to determine when a convergence condition has occurred with respect to determination of the matching input sample relative to the aforementioned buffer.

By finding the matching sample to a self-received sample in the buffer, methods and apparatus according to the present invention permit more precise and updateable determination of the delays involved in the RF modulation and amplification stages of the amplifier and the self-receiver, thus allowing for more precise and aggressive adaptive predistortion to be used. This ultimately results in an RF power amplifier having a more linear gain response, which is useful for e.g. extending the range of wireless communications systems, and also allow the incorporation of less expensive but less linear RF power amplifier circuitry in cost-conscious configurations.

Additional aspects and advantages of this invention will be apparent from the following detailed description of embodiments thereof, which proceeds with reference to the accompanying drawings.

DETAILED DESCRIPTION OF THE EMBODIMENTS

Figure 1:
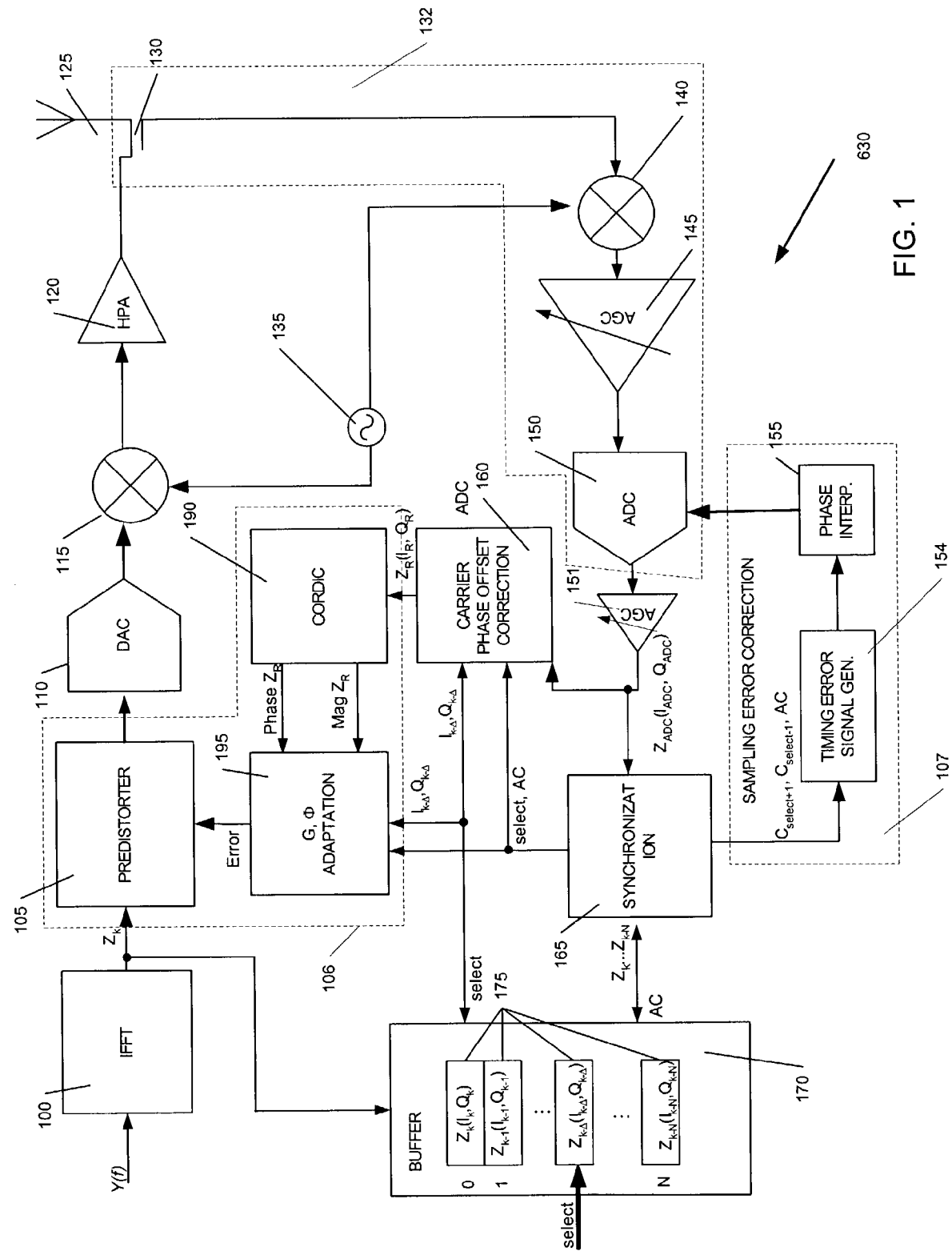
FIG. 1 is a block diagram of a linearizing amplifier according to a first embodiment of the invention.

Turning first to FIG. 1, FIG. 1 depicts a linearizing amplifier 630 according to a first embodiment of the invention. Here, though not required as will be appreciated by those ordinarily skilled in the art, input signal Y(f) is presented as a multi-carrier OFDM-encoded digital signal waveform compliant with IEEE 802.11a (1999) and Draft IEEE 802.11g (2002) transmission rate standards. This input signal Y(f) presents data intended for modulation, amplification and transmission in analog form consistent with these IEEE 802.11a and 802.11g standards.

An inverse fast Fourier transform ("IFFT") unit 100 converts the frequency domain input signal Y(f) into a corresponding baseband digital waveform in the time domain as is well known in the art on a per sample basis. As shown in FIG. 1, the output of the IFFT 100 per unit time is shown as complex waveform sample $Z_k$, and referred to generically herein as input signal samples or input samples. Specific input samples processed by the IFFT 100 preceding $Z_k$ in time are denoted herein relative to $Z_k$. Consider, for example, $Z_{k-x}$, where x represents the number of time units that the sample $Z_{k-x}$ precedes sample $Z_k$. Consistent with the IEEE 802.11a and 802.11g standards, synchronous digital components of the signal processing apparatus of the linearizing amplifier 630, including the IFFT 100, the predistortion unit 106, the buffer 170, the synchronization unit 165, the timing recovery unit 107, the phase-shift correction unit 160 and converters 110, 150 operate from a common 40 MHz clock (not shown), although in other transmission applications, such clock synchronization need not exist or operate at different or differing frequencies as long as their function remains consistent with the teachings of the present invention. Thus, the unit time in this embodiment is 25 ns.

Still referring to FIG. 1, $Z_k$ is then fed to predistorter 105 of the predistortion unit 106 which performs amplitude—amplitude and amplitude-phase distortion with reference to a distortion correction function (labeled ERROR in FIG. 1) generated by the gain & phase adaptation unit in order to compensate for the nonlinear effects of the high power amplifier 120 and consequent distortion components it may introduce. As will be discussed in more detail below, the distortion correction function according to this embodiment is calculated by comparing a time domain input sample preceding $Z_k$ which corresponds most closely to a self-received signal $Z_{ADC}$ perceived by the self-receiver 132 while $Z_k$ undergoes selective predistortion correction. This preceding input sample will be referred herein as the matching input sample or Zk–Δ wherein Δ represents the index into the buffer 170 where the matching input sample is stored (at address select within the buffer 170), or the number of clock cycles representing the delay between the input to the predistorter 105 and the output of the self-receiver 132. For example, a Δ value of 8 would mean that the corresponding input sample would be 8 locations deep into the buffer 170, and assuming a clock rate of 40 MHz, the linearizing amplifier 630 would be exhibiting a 8*25 ns or 200 ns delay between the input and self-received signal.

In order to properly apply predistortion correction to linearize the response of a nonlinear amplifier such as the high power amplifier 120 of the present embodiment, comparison between the input signal and the output signal of the high power amplifier needs to be performed. In fact, for best performance in high speed transmission systems requiring relatively high peak-to-average ratios, such as that encountered in multi-carrier wireless applications including IEEE 802.11a and 802.11g compliant systems, it is desirable that the comparison be made of matching input and output signals relative to time. In other words, it is desirable that the output signal from the amplifier is compared to its corresponding input signal prior to predistortion correction. A self-receiver communicatively coupled to the output of the power amplifier is commonly used to receive, attenuate and condition the output signal of the amplifier as a self-receive signal for input signal comparison purposes.

Because of the nature of the involved transmission and self-reception circuitry, it is well known that a implementation-specific and potentially varying delay exists between the predistorter input and the self-receiver output in current adaptive predistortion systems which should be accounted for in order to match the input and output signals. Known adaptive predistortion systems appear to account for this delay, but almost universally do so on an implementation specific basis, which apparently takes into account: 1) specific implementation component delays (such as that introduced by selected FIR filtering mechanisms used to condition the result of digital-to-analog and analog-to-digital conversion); and 2) iterative feedback trial-and-error verification and modification when placing these selected components into a predistortion design. Moreover, it is believed that these delay design considerations assume a static delay response characteristic of the predistortion system, which tends to oversimplify if not disregard the effects of variable delays brought on input/output signal variation, not to mention component aging and environmental effects such as operating temperature, etc.

However, consistent with the present invention, a dynamic approach is taken with respect to the present embodiment that focuses attention away from specific component characteristics, delay assumptions, and trial-and-error and instead uses a combination of a plurality of input samples stored over time in combination with correlation function properties in order to find the experienced time delay between the input signal and the self-received signal. This delay may change over a number of correlation iterations over time until convergence is reached, or alternatively after a certain number of correlation iterations have occurred.

As shown in FIG. 1, in this particular embodiment, in order to match a realized sample of self-received signal ($Z_{ADC}$) generated by the self-receiver 132 with its corresponding (and previously occurring) input signal sample prior to selective predistortion correction by the predistorter 105, the signal prior to predistortion, a buffer 170 coupled to the output of the IFFT and the input of the predistorter 105 to store a given number of input samples. This buffer is of sufficient depth (N) in view of the digital clock rate of the linearizing amplifier 630 in order to accommodate for worst case delays between the input of the predistorter 105 and the digital output of the self-receiver 132, shown in FIG. 1 occurring at the output of analog-to-digital converter 150, although in an alternative embodiment, the depth could be limited to one reasonably likely to account for such delay. In either event, the depth of the buffer 170 is such that the input sample corresponding most closely to the realized output signal of the self-receiver 132 is at least reasonably likely to still be contained in the buffer 170.

The buffer 170 can conveniently comprise a shift register or FIFO with persistent parallel access to stored contents. Moreover, in this embodiment, each memory location 175 in buffer 170 will be able to store at least in-phase ("I") and quadrature phase ("Q") components of a given input sample generated by the IFFT 100.

In this embodiment, the realized sample of the self-received signal are synchronized through correlating this realized sample against the contents of the buffer 170. To this end, a synchronization unit 165 is provided that, during its active phase as will be discussed in more detail with reference to FIG. 2, the synchronization unit 165 will take the I and Q components of this stored transmit signals $Z_k \ldots Z_{k-N}$, derive the magnitude for each of the stored transmit signals $Z_k \ldots Z_{k-N}$, and correlate the generated magnitudes against the magnitude of the realized sample of self-received signal ($|Z_{ADC}|$). This self-received signal is subject to a potential static carrier phase offset which should be corrected in order to more accurately generate the distortion correction function, thus a carrier phase offset correction unit 160 is provided to perform the same as needed. More detail on carrier phase offset correction according to the present embodiment will be discussed below with reference to FIG. 3. However, the magnitude needs no further correction, and thus the magnitude of $Z_{ADC}$ may be used. Therefore, potential delay in realization of the self-received signal caused by the carrier phase offset correction unit 160 alone or in combination with the Coordinate Rotation Digital Computer or "CORDIC" 190 may be avoided. Though not shown in FIG. 1, alternative embodiments may utilizes the self-received signal after carrier phase offset correction by the carrier phase offset correction unit 160 and possibly even post magnitude and phase realization via the CORDIC 190 for comparison purposes. If delays introduced by the carrier phase offset correction unit 160 and CORDIC 190 can be accounted for by, e.g. further increasing the depth of the buffer 170, this arrangement may simplify design of the synchronization unit 165 by eliminating the need for a separate magnitude calculation of $Z_{ADC}$, since Mag $Z_R$(a.k.a. $|Z_R|$) produced by the CORDIC 190 is equivalent thus allowing the magnitude calculated by the core deck 190 to be shared between the adaptation unit 195 and the synchronization unit 165.

Although not required, in the embodiment shown in FIG. 1, the AGC 145 is a relatively coarse gain controller suitable for a wide range of attenuation and amplitude control activities to normalize the self-received signal to nominal amplitude to ensure proper analog-to-digital translation by the ADC 150. To further improve small signal gain estimation and synchronization activities consistent with the current embodiment, a relatively fine resolution automatic gain control unit 151 is provided coupled to the output of the ADC 150 to boost its signal output towards the ADC built-in limits.

Once the magnitudes for the realized sample of the self-received signal and the stored input samples are calculated, the synchronization unit 165 of the embodiment shown in FIG. 1 will then correlate the input sample magnitudes $|Z_k \ldots Z_{k-N}|$ using $|Z_{ADC}|$ as a reference and then determine which input sample most closely corresponds to or matches the realized sample of the self-received signal. This is known as the matching input sample, and is denoted in the figures as $Z_{k-\Delta}$ or $Z_{select}$. More details on such correlation will be discussed below with reference to FIG. 2.

After correlation has been performed, the synchronization unit 165 shown in FIG. 1 will then identify a pointer (select) into the buffer 170 whose contents include the I and Q values for the matching input sample. This pointer is sent to the phase-shift correction unit 160 and the adaptation unit 195 so that they in turn can access the matching input sample values directly from buffer 170 to perform phase-shift correction and predistortion function generation in accordance with the present embodiment. This configuration eases transition of the signal processing apparatus when a converged state has been reached. Alternatively, though not shown in the figures, the index $\Delta$ or the I, Q values of the matching input sample themselves may be provided.

Also as noted in FIG. 1, the synchronization unit 165 also issues a binary semaphore AC to the aforementioned adaptation unit 195, phase-shift correction unit 160 as well as the sampling error correction unit 155 to indicate when input sample-self-receive sample comparison is actually being performed consistent with the present embodiment. More specifically, if AC is asserted high by the synchronization unit 165, this indicates that the synchronization unit is active and that the select pointer identified by the synchronization unit is subject to revision. Thus, the adaptation unit 195 and the phase-shift correction unit 160 will utilize the contents of buffer 170 specified by the select pointer as it is being potentially revised or updated by the synchronization unit 165.

However, in this embodiment, a false assertion of the AC semaphore indicates that the synchronization unit 165 is no longer actively comparing the contents of buffer 170 against the realized sample of the self-received signal, having previously determined or assumed that a convergence in the delay between the self-received signal and the input signal has occurred. Therefore, in this embodiment, upon detection that the AC semaphore is false, the adaptation unit 195 and the phase-shift correction unit 160 will use the last select pointer transmitted by the synchronization unit 165 before the AC semaphore transitioned to false. Though not shown in the figures, suitable logic and a falling edge triggered latch or other memory may be used to retain this value while the synchronization unit is inactive and the AC semaphore is false. Once the delay between the transmit and the self-received signal is identified which in this embodiment is done by the synchronization unit determining how deep in the buffer 170 to look to find the transmit signal that matches the self-received signal at a given unit time.

Still referring to FIG. 1, after predistortion correction function generation performed by the adaptation unit 195 and selective application of this function to the input sample $Z_k$, this input sample is then converted into baseband analog form consistent with physical layer requirements of the IEEE 802.11a and 802.11g standards by the digital-to-analog converter 110 and RF modulated by the appropriate carrier frequency by the up converter 115. Thereafter the RF modulated and selectively predistorted input signal is amplified by the nonlinear amplifier 120 and broadcast via RF antenna 125. Predistortion correction consistent with the present embodiment thereafter continues in time with the next ($Z_{k+1}$) and subsequent IFFT 100 generated samples of Y(f).

The self-receiver 132 of the linearizing amplifier unit 630 of FIG. 1 begins with RF coupler 130 to receive and attenuate the output of the high performance amplifier 120, and then relay the received attenuated RF signal and down convert it to analog baseband form by the down converter 140. Next, the down converted but still analog signal goes through further attenuation, filtering and conditioning in a known matter as it passes through the automatic gain control circuit 145 and then finally on to the analog-to-digital converter to recover the self-received signal in digital form suitable for comparison with the input samples.

It should be noted that, in this embodiment, the RF up converter 115 and the RF down converter 140 utilize a common local oscillator 135 thereby eliminating the need to compensate for potential frequency drift between the transmit and self-receive signal paths. This aspect is further strengthened by the design choice of physically placing the transmit and self-receiver units of the linearizing amplifier in close physical proximity such as on a common substrate, board or chip. It should be realized, however, that frequency drift compensation is well-known in the art, and that separate transmit and self-receive oscillators may be used which may indeed impart frequency errors but nevertheless do not depart from the teachings of the invention. For example, instead of using first order feedback loops in the common oscillator case described above, higher order effects can be corrected using corresponding higher order feedback loops as will be appreciated by those ordinarily skilled in the art.

Figure 2:
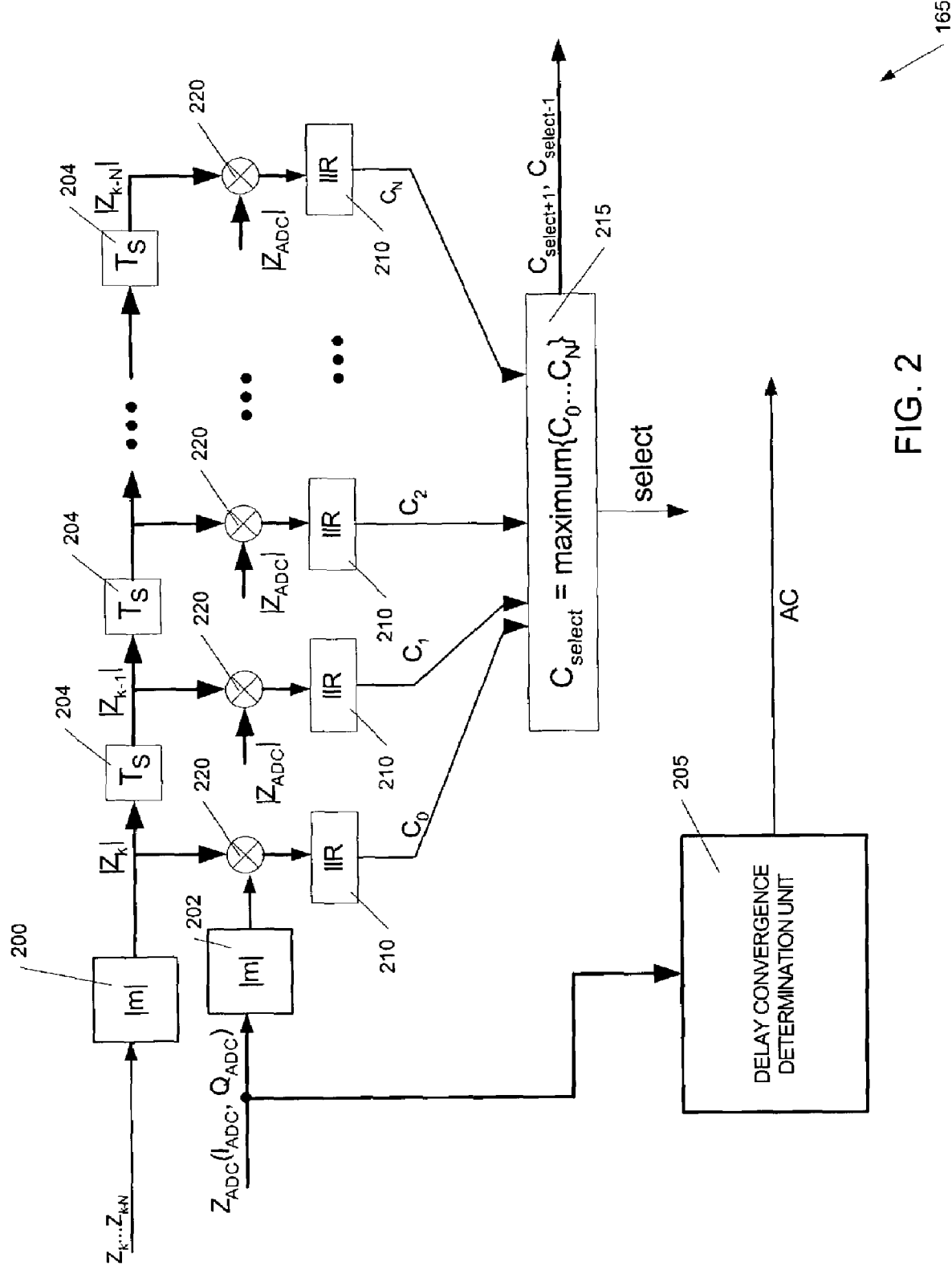
FIG. 2 is a more detailed block diagram of the auto correlation unit 165 shown in FIG. 1.

More detail on the synchronization unit 165 will be discussed hereinbelow with reference to FIG. 2. FIG. 2 illustrates a more detailed block diagram of the synchronization unit 165 initially shown in FIG. 1. As shown in FIG. 2, a magnitude generation unit 200 is used to convert the stored I and Q values for the stored input samples from time k–N to present (k) into corresponding magnitudes and store these magnitudes in shift register 204 from oldest to newest in sequence. Likewise, the magnitude generation unit 202 is used to determine the magnitude of the realized sample of the self-received signal.

Once all magnitudes for the stored input samples are determined (i.e. $|Z_k| \ldots |Z_{k-N}|$ are known), they are scalar multiplied in parallel by the magnitude of the self-received signal ($|Z_{ADC}|$ in order to find a correspondence between the stored input samples and the realized sample of the self-received signal. The result of the scalar multiplication are filtered and stored in a bank of one pole IIR filters 210 as shown in FIG. 2. Thereafter, the correlation circuit logic 215 will find the maximum scalar product contained in the IIR filter bank 210 and determine both the index Δ into the buffer whose correlation result is perceived to be at a maximum as the matching input sample. The correlation circuit logic 215, having knowledge of the starting address of the buffer 170 and Δ, determines the select pointer into the buffer containing the starting address defining the matching input sample.

As shown in the figures, the correlation circuit logic 215 of the synchronization unit 165 also passes on the immediately preceding and immediately proceeding correlation values ($C_{select-1}$, $C_{select+1}$ respectively in the figures) contained in the IIR bank 210 to the sampling error correction unit 107. As will be discussed in more detail herein with reference to FIG. 5, the immediately preceding and immediately proceeding correlation values are delivered to the sampling error correction unit 107 in order to generate a timing error signal used selectively used to correct potential sampling errors introduced by the analog-to-digital converter 150 as a result of a sampling phase which operates independently of the transmitter digital-to-analog converter 110. This results in even more accurate comparison between the corrected self-received signal and the corresponding input sample.

Still referring to FIG. 2, the delay convergence determination unit 205 is shown as part of the synchronization unit 165 in order to determine when correlation processing described above should be performed. In this embodiment, delay convergence is presumed after a certain number of correlation iterations have occurred (e.g., 30 packets into an 80 packet frame of 802.11 a or 802.11g formatted data) and thus would monitor the self-received signal $Z_{ADC}$ and assert AC for only the first 30 packets into the current frame of data. In an alternative embodiment, delay convergence can actually be determined based on historical analysis of the select pointer or index Δ to follow trends towards convergence to a reference value, using well known convergence analysis techniques. Once delay convergence is reached and using this or other known techniques as well be appreciated by those ordinarily skilled in the art, the AC semaphore is then asserted false by the delay convergence determination unit 205 in this embodiment so that the converged select pointer is maintained for an appropriate time (e.g. until the end of the current packet has been reached) within the aforementioned memory of the adaptation unit 195 and the phase-shift correction unit 160.

Figure 3:
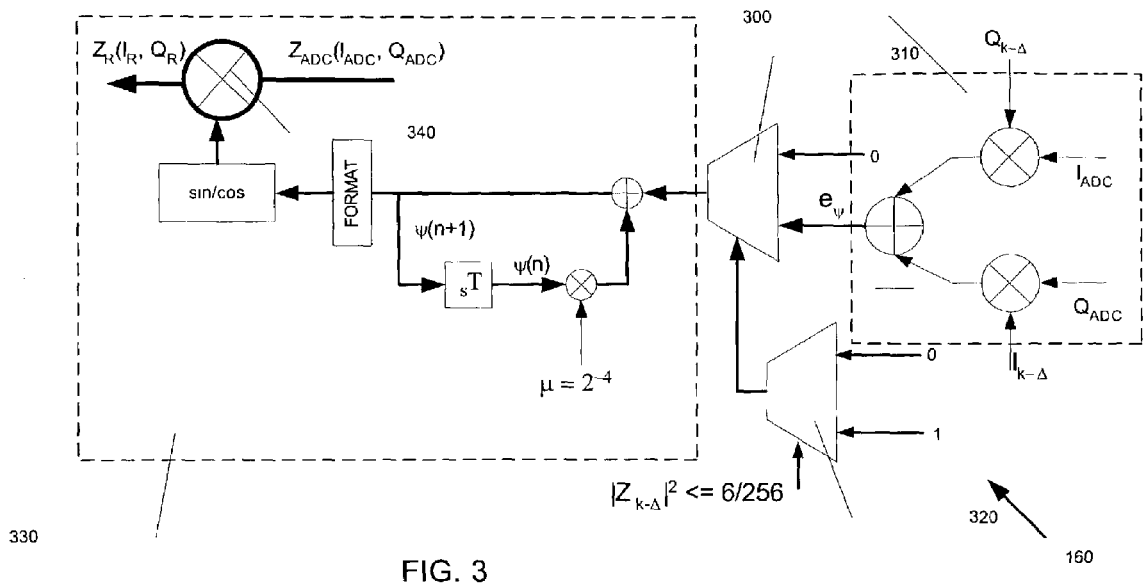
FIG. 3 is a more detailed block diagram of the phase-shift correction unit 160 shown in FIG. 1.

Carrier phase offset correction in accordance with the present embodiment is now detailed with reference to FIG. 3. As shown in FIG. 3, carrier phase offset errors are corrected using a known decision-directed maximum likelihood detector arrangement 300, 310, 320 and 330 in which decisions of received samples are the corresponding transmitted samples.

Figure 4:
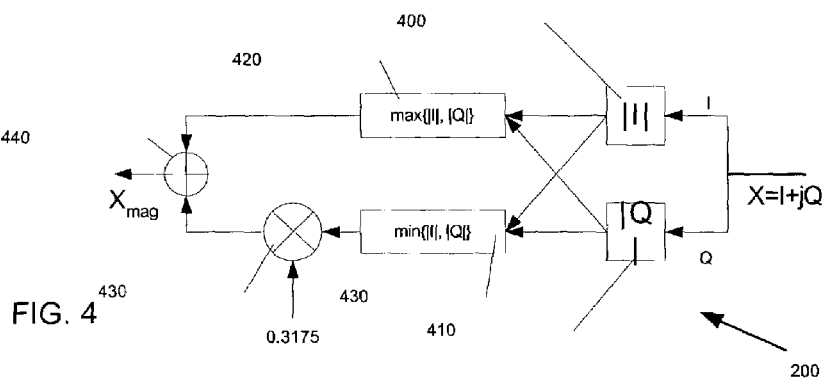
FIG. 4 is a more detailed block diagram of the magnitude generator 200 shown in FIG. 2.

FIG. 4 is a more detailed block diagram of the magnitude determination unit 200 shown in FIG. 2. This unit comprises well understood techniques for approximating the magnitude of a given complex form digital signal based on the I and Q values corresponding to such signal. Other techniques may be used to arrive at the same result, as would be understood by those ordinarily skilled in the art.

Figure 5:
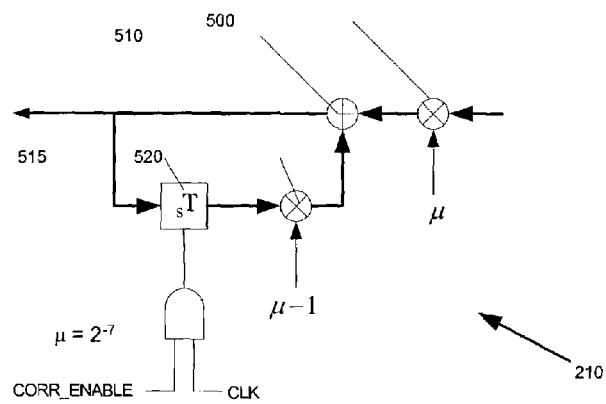
FIG. 5 is a more detailed block diagram of one of the IIR filters 210 shown in FIG. 2.

FIG. 5 is a more detailed block diagram of the IIR filter 210 used to store the correlation results of a given transmit signal against the self-received signal. The IIR filter 210 smooths the signal by reducing inherent self-noise in the data.

Figure 7:
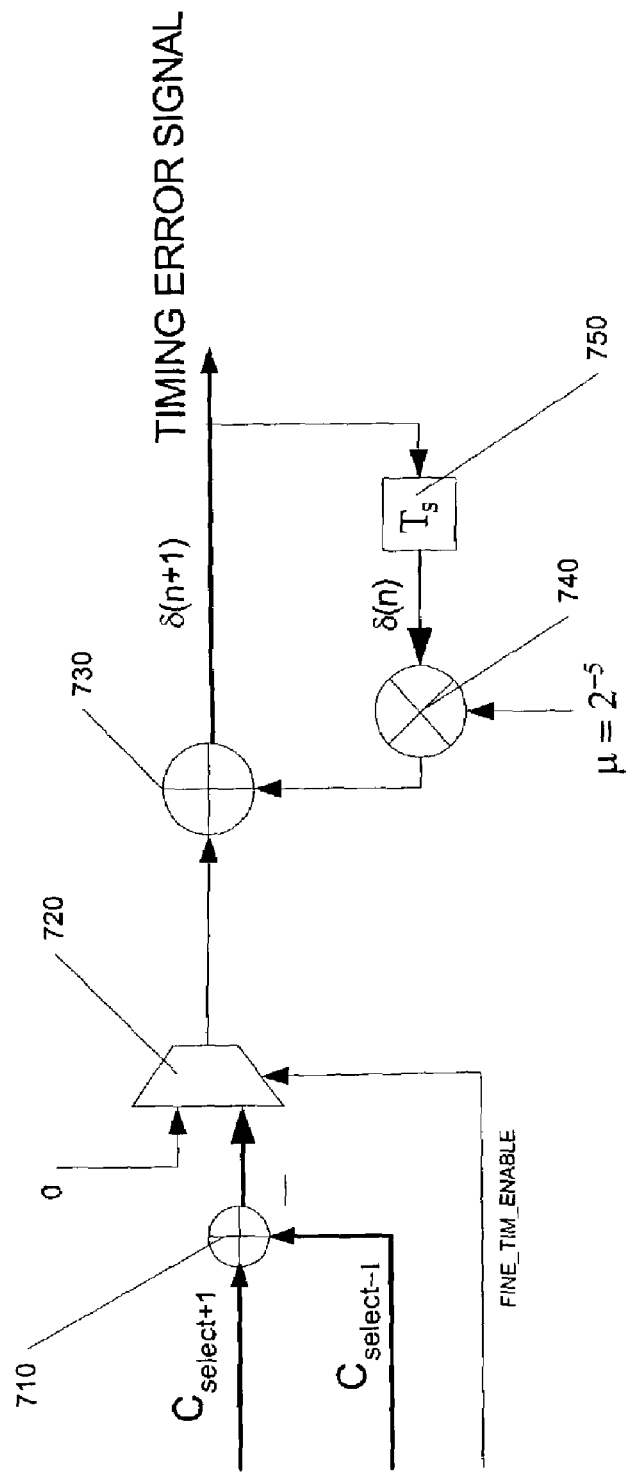
FIG. 7 is a block diagram of the timing error generation circuit 154 shown in FIG. 1.

FIG. 7 depicts a timing error generation unit 154 forming part of the sampling error correction unit 107 shown in FIG. 1. It should be realized that the error signal is generated with reference to correlation values $C_{select+1}$, $C_{select-1}$ found by the synchronization unit 165 described hereinabove, and that known timing recovery techniques are implemented in this embodiment with reference to this error to control a conventional phase interpolator 155 which, in turn, adjusts sampling of the analog-to-digital converter 150 in a known manner.

Figure 6:
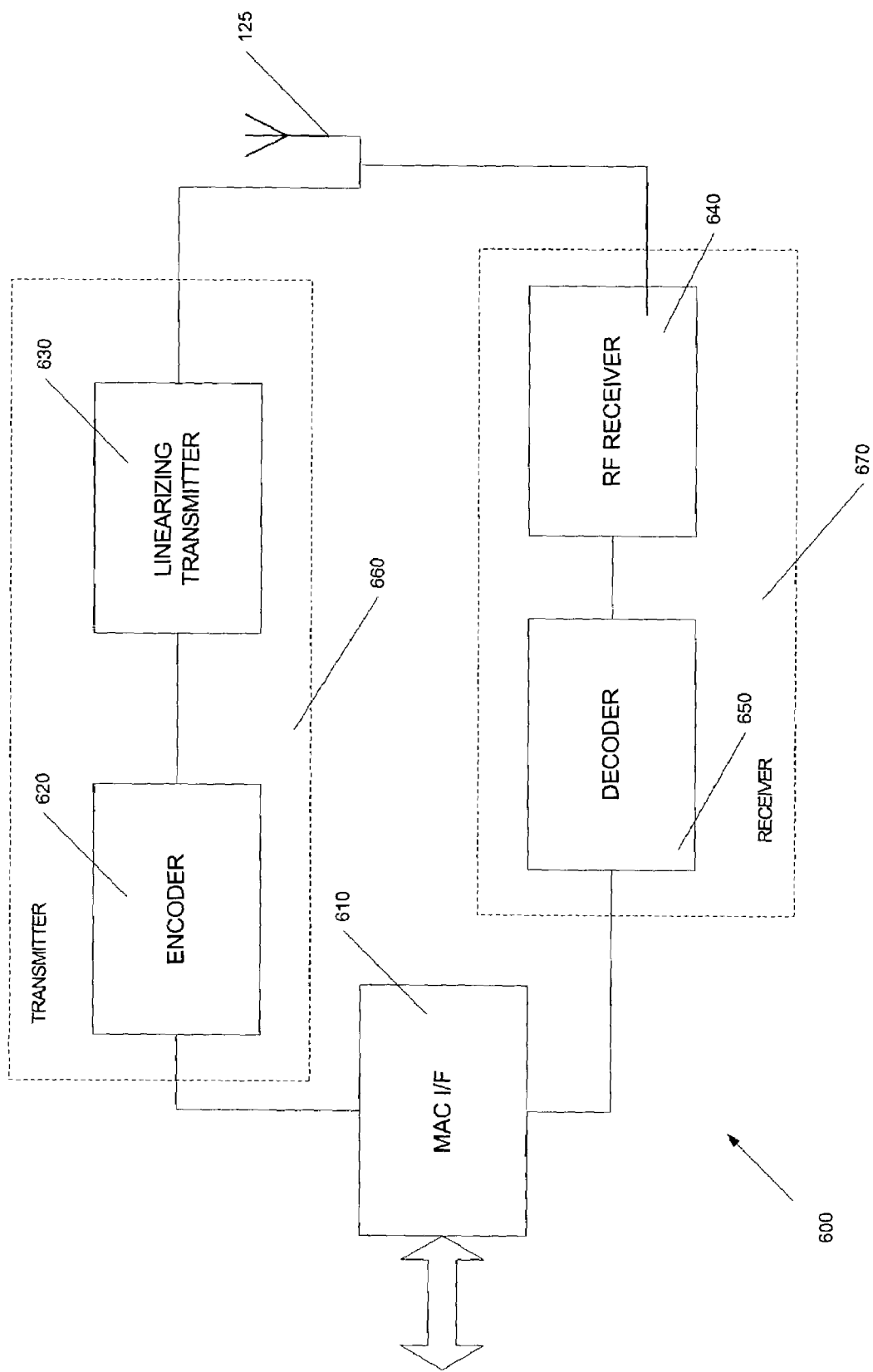
FIG. 6 is a simplified block diagram of a wireless transceiver consistent with the first embodiment of the invention.

FIG. 6 illustrates a wireless communications transceiver 600 consistent with the present embodiment which incorporates linearizing amplifier 630 of FIG. 1 as part of a greater transmitter 660 arranged in accordance with IEEE 802.11a and 802.11g standards. Specifically, the linearizing amplifier 630, including the self-receiver 132 forms part of the transmitter portion 660 of the transceiver 600 along with base band encoder 620. Though not required, the receiver 670 and the transmitter 660 share a common RF antenna 125 for broadcasting and reception operations and an OSI layer 2+MAC interface 610 as a type of network interface to transfer data of interest between the transceiver and higher layer processes and applications serviced by the transceiver 600. Though not shown in FIG. 6, the transceiver 600 may form an operational part of a network interface apparatus such as a PC Card capable of interfacing with the CPU or information processor of an information processing apparatus such as a desktop or laptop computer, integrated directly within such information processing apparatus, or form an operational component of a wireless communications access point such as a base station as will be appreciated by those ordinarily skilled in the art.

Figure 8:
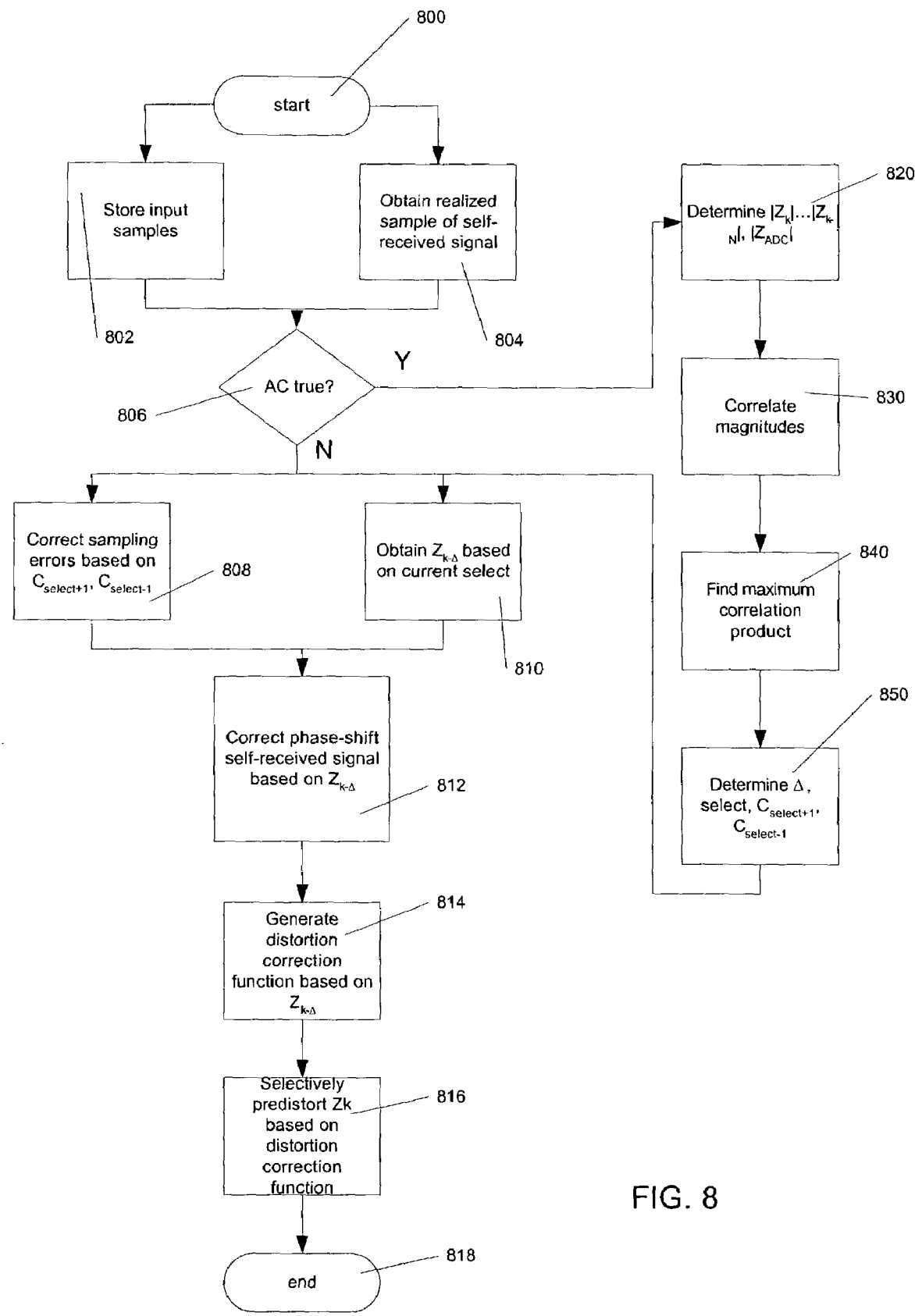
FIG. 8 is a flowchart illustrating signal processing according to an alternative embodiment of the invention.

FIG. 8 is a flowchart describing predistortion signal processing according to an alternative embodiment of the invention. In this embodiment, predistortion symbol processing may be performed by an ASIC and/or a programmed information processor such as a microprocessor, or microcontroller as well as a digital signal processor designed to execute the sequence of steps described in the flowchart of FIG. 8, and or any subset thereof in combination with one or more components of the linearizing amplifier 630 described above.

It will be obvious to those having skill in the art that many changes may be made to the details of the above-described embodiments of this invention without departing from the underlying principles thereof. The scope of the present invention should, therefore, be determined only by the following claims.

What is claimed is:

1. Signal processing apparatus capable of correcting signal distortion introduced by an RF power amplifier, comprising:

a buffer to store a plurality of samples representing at least a portion of an input signal, the input signal intended for amplification by the RF power amplifier;

a self-receiver to receive an output signal generated by the RF power amplifier;

a synchronization unit responsive to said buffer and said self-receiver to determine, as a matching input sample, which of the stored plurality of samples corresponds most closely to the output signal; and a predistortion unit responsive to said synchronization unit and said buffer to selectively apply a distortion correction function to the input signal prior to amplification by the RF power amplifier, the distortion correction function being derived from a relationship between the matching input sample and the output signal.

2. The signal processing apparatus of claim 1, wherein said self-receiver includes an analog-to-digital converter to realize a sample of the output signal; and wherein said synchronization unit comprises a correlation unit which correlates a characteristic for each of the stored plurality of samples against a similar characteristic of the realized sample of the output signal.

3. The signal processing apparatus of claim 2, wherein the characteristic comprises a magnitude.

4. The signal processing apparatus of claim 2, further comprising:

a phase offset correction unit responsive to said analog-to-digital converter, said correlation unit and said buffer, said phase offset correction unit to correct a phase offset in the realized sample of the output signal relative to the matching input symbol; and wherein said predistortion unit comprises an adaptation unit responsive to said phase offset correction unit to derive the distortion correction function based on a relationship between the matching input sample and the phase offset corrected realized sample of the output signal.

5. The signal processing apparatus of claim 4, further comprising a sampling phase error correction unit communicatively coupled to said analog-to-digital converter, said sampling phase error correction unit to provide sampling alteration information to said analog-to-digital converter to cause said analog-to-digital converter to selectively alter sampling of the output signal.

6. The signal processing apparatus of claim 5, wherein said correlation unit:

generates a first correlation result for one of stored plurality of samples immediately preceding the matching input sample in said buffer; and generates a second correlation result for one of the stored plurality of samples immediately proceeding the matching input sample in said buffer; and wherein said sampling phase error correction unit is responsive to said correlation unit to generate the sampling alteration information based on a relationship between the first and second correlation results.

7. The signal processing apparatus of claim 2, further comprising a sampling phase error correction unit communicatively coupled to said analog-to-digital converter, said sampling phase error correction unit to provide sampling alteration information to said analog-to-digital converter to cause said analog-to-digital converter to selectively alter sampling of the output signal.

8. The signal processing apparatus of claim 7, wherein said correlation unit:
   generates a first correlation result for one of stored plurality of samples immediately preceding the matching input sample in said buffer; and
   generates a second correlation result for one of the stored plurality of samples immediately proceeding the matching input sample in said buffer; and
   wherein said sampling phase error correction unit is responsive to said correlation unit to generate the sampling alteration information based on a relationship between the first and second correlation results.

9. The signal processing apparatus of claim 1, wherein said synchronization unit comprises a convergence determination unit to determine when a convergence condition has occurred with respect to determination of the matching input sample relative to said buffer.

10. A transceiver, comprising:
   an RF power amplifier; and
   a signal processing apparatus capable of correcting signal distortion introduced by said RF power amplifier, comprising:
      a buffer to store a plurality of samples representing at least a portion of an input signal, the input signal intended for amplification by said RF power amplifier;
      a self-receiver to receive an output signal generated by said RF power amplifier;
      a synchronization unit responsive to said buffer and said self-receiver to determine, as a matching input sample, which of the stored plurality of samples corresponds most closely to the output signal; and
      a predistortion unit responsive to said synchronization unit and said buffer to selectively apply a distortion correction function to the input signal prior to amplification by the RF power amplifier, the distortion correction function being derived from a relationship between the matching input sample and the output signal.

11. The transceiver of claim 10, wherein
   said self-receiver includes an analog-to-digital converter to realize a sample of the output signal; and
   wherein said synchronization unit comprises a correlation unit which correlates a characteristic for each of the stored plurality of samples against a similar characteristic of the realized sample of the output signal.

12. The transceiver of claim 11, wherein the characteristic comprises a magnitude.

13. The transceiver of claim 11, further comprising:
   a phase offset correction unit responsive to said analog-to-digital converter, said correlation unit and said buffer, said phase offset correction unit to correct a phase offset in the realized sample of the output signal relative to the matching input symbol; and
   wherein said predistortion unit comprises an adaptation unit responsive to said phase offset correction unit to derive the distortion correction function based on a relationship between the matching input sample and the phase offset corrected realized sample of the output signal.

14. The transceiver of claim 13, further comprising a sampling phase error correction unit communicatively coupled to said analog-to-digital converter, said sampling phase error correction unit to provide sampling alteration information to said analog-to-digital converter to cause said analog-to-digital converter to selectively alter sampling of the output signal.

15. The transceiver of claim 14, wherein said correlation unit:
   generates a first correlation result for one of stored plurality of samples immediately preceding the matching input sample in said buffer; and
   generates a second correlation result for one of the stored plurality of samples immediately proceeding the matching input sample in said buffer; and
   wherein said sampling phase error correction unit is responsive to said correlation unit to generate the sampling alteration information based on a relationship between the first and second correlation results.

16. The transceiver of claim 11, further comprising a sampling phase error correction unit communicatively coupled to said analog-to-digital converter, said sampling phase error correction unit to provide sampling alteration information to said analog-to-digital converter to cause said analog-to-digital converter to selectively alter sampling of the output signal.

17. The transceiver of claim 16, wherein said correlation unit:
   generates a first correlation result for one of stored plurality of samples immediately preceding the matching input sample in said buffer; and
   generates a second correlation result for one of the stored plurality of samples immediately proceeding the matching input sample in said buffer; and
   wherein said sampling phase error correction unit is responsive to said correlation unit to generate the sampling alteration information based on a relationship between the first and second correlation results.

18. The transceiver of claim 10, wherein said synchronization unit comprises a convergence determination unit to determine when a convergence condition has occurred with respect to determination of the matching input sample relative to said buffer.

19. A network interface apparatus, comprising:
   a network interface;
   a transceiver communicatively coupled to said network interface, said transceiver comprising:
      an RF power amplifier; and
      a signal processing apparatus capable of correcting signal distortion introduced by said RF power amplifier, comprising:
         a buffer to store a plurality of samples representing at least a portion of an input signal, the input signal intended for amplification by said RF power amplifier;
         a self-receiver to receive an output signal generated by said RF power amplifier;
         a synchronization unit responsive to said buffer and said self-receiver to determine, as a matching input sample, which of the stored plurality of samples corresponds most closely to the output signal; and
         a predistortion unit responsive to said synchronization unit and said buffer to selectively apply a distortion correction function to the input signal prior to amplification by the RF power amplifier, the distortion correction function being derived from a relationship between the matching input sample and the output signal; and
   an antenna coupled to said transceiver capable of broadcasting the output signal across a medium.

20. An information processing apparatus, comprising:
   a CPU; and
   a network interface apparatus responsive to said CPU, comprising:

a network interface;
a transceiver communicatively coupled to said network interface, said transceiver comprising:
an RF power amplifier; and
a signal processing apparatus capable of correcting signal distortion introduced by said RF power amplifier, comprising:
a buffer to store a plurality of samples representing at least a portion of an input signal, the input signal intended for amplification by said RF power amplifier;
a self-receiver to receive an output signal generated by said RF power amplifier;
a synchronization unit responsive to said buffer and said self-receiver to determine, as a matching input sample, which of the stored plurality of samples corresponds most closely to the output signal; and
a predistortion unit responsive to said synchronization unit and said buffer to selectively apply a distortion correction function to the input signal prior to amplification by the RF power amplifier, the distortion correction function being derived from a relationship between the matching input sample and the output signal; and
an antenna coupled to said transceiver capable of broadcasting the output signal across a medium.

21. Signal processing apparatus capable of correcting signal distortion introduced by an RF power amplifier, comprising:
means for storing a plurality of samples representing at least a portion of an input signal, the input signal intended for amplification by the RF power amplifier;
means for receiving an output signal generated by the RF power amplifier;
means for determining, as a matching input sample, which of the stored plurality of samples corresponds most closely to the output signal; and
means for selectively applying a distortion correction function to the input signal prior to amplification by the RF power amplifier, the distortion correction function being derived from a relationship between the matching input sample and the output signal.

22. The signal processing apparatus of claim 21, wherein said receiving means includes means for realizing a sample of the output signal; and
wherein said determining means comprises means for correlating a characteristic for each of the stored plurality of samples against a similar characteristic of the realized sample of the output signal.

23. The signal processing apparatus of claim 22, wherein the characteristic comprises a magnitude.

24. The signal processing apparatus of claim 22, further comprising:
means for correcting a phase offset in the realized sample of the output signal relative to the matching input symbol; and
wherein said applying means comprises means for deriving the distortion correction function based on a relationship between the matching input sample and the phase offset corrected realized sample of the output signal.

25. The signal processing apparatus of claim 24, further comprising means for providing sampling alteration information to said realizing means to cause said realizing means to selectively alter sampling of the output signal.

26. The signal processing apparatus of claim 25, wherein said correlating means:
generates a first correlation result for one of stored plurality of samples immediately preceding the matching input sample in said storing means; and
generates a second correlation result for one of the stored plurality of samples immediately proceeding the matching input sample in said storing means; and
wherein said providing means generates the sampling alteration information based on a relationship between the first and second correlation results.

27. The signal processing apparatus of claim 22, further comprising means for providing sampling alteration information to said realizing means to cause said realizing means to selectively alter sampling of the output signal.

28. The signal processing apparatus of claim 27, wherein said correlating means:
generates a first correlation result for one of stored plurality of samples immediately preceding the matching input sample in said storing means; and
generates a second correlation result for one of the stored plurality of samples immediately proceeding the matching input sample in said storing means; and
wherein said providing means generates the sampling alteration information based on a relationship between the first and second correlation results.

29. The signal processing apparatus of claim 21, wherein said determining means comprises means for determining when a convergence condition has occurred with respect to determination of the matching input sample relative to said buffer.

30. A transceiver, comprising:
means for amplifying an input signal; and
means for correcting signal distortion introduced by said amplifying means, comprising:
means for storing a plurality of samples representing at least a portion of the input signal;
means for receiving an output signal generated by said amplifying means;
means for determining, as a matching input sample, which of the stored plurality of samples corresponds most closely to the output signal; and
means for selectively applying a distortion correction function to the input signal prior to amplification by the RF power amplifier, the distortion correction function being derived from a relationship between the matching input sample and the output signal.

31. The transceiver of claim 30, wherein
said receiving means includes means for realizing a sample of the output signal; and
wherein said determining means comprises means for correlating a characteristic for each of the stored plurality of samples against a similar characteristic of the realized sample of the output signal.

32. The transceiver of claim 31, wherein the characteristic comprises a magnitude.

33. The transceiver of claim 31, further comprising:
means for correcting a phase offset in the realized sample of the output signal relative to the matching input symbol; and
wherein said applying means comprises means for deriving the distortion correction function based on a relationship between the matching input sample and the phase offset corrected realized sample of the output signal.

34. The transceiver of claim 33, further comprising means for providing sampling alteration information to said realizing means to cause said realizing means to selectively alter sampling of the output signal.

35. The transceiver of claim 34, wherein
said correlating means:
generates a first correlation result for one of stored plurality of samples immediately preceding the matching input sample in said storing means; and
generates a second correlation result for one of the stored plurality of samples immediately proceeding the matching input sample in said storing means; and
wherein said providing means generates the sampling alteration information based on a relationship between the first and second correlation results.

36. The transceiver of claim 31, further comprising means for providing sampling alteration information to said realizing means to cause said realizing means to selectively alter sampling of the output signal.

37. The transceiver of claim 36, wherein
said correlating means:
generates a first correlation result for one of stored plurality of samples immediately preceding the matching input sample in said storing means; and
generates a second correlation result for one of the stored plurality of samples immediately proceeding the matching input sample in said storing means; and
wherein said providing means generates the sampling alteration information based on a relationship between the first and second correlation results.

38. The transceiver of claim 30, wherein said determining means comprises means for determining when a convergence condition has occurred with respect to determination of the matching input sample relative to said buffer.

39. A network interface apparatus, comprising:
means for interfacing to a network;
transceiver means comprising:
means for amplifying an input signal; and
means for correcting signal distortion introduced by said amplifying means, comprising:
means for storing a plurality of samples representing at least a portion of the input signal;
means for receiving an output signal generated by said amplifying means;
means for determining, as a matching input sample, which of the stored plurality of samples corresponds most closely to the output signal; and
means for selectively applying a distortion correction function to the input signal prior to amplification by the RF power amplifier, the distortion correction function being derived from a relationship between the matching input sample and the output signal; and
means for broadcasting the output signal across a medium.

40. An information processing apparatus, comprising:
central processing means; and
a network interface apparatus, comprising:
means for interfacing to a network;
transceiver means comprising:
means for amplifying an input signal; and
means for correcting signal distortion introduced by said amplifying means, comprising:
means for storing a plurality of samples representing at least a portion of the input signal;
means for receiving an output signal generated by said amplifying means;
means for determining, as a matching input sample, which of the stored plurality of samples corresponds most closely to the output signal; and
means for selectively applying a distortion correction function to the input signal prior to amplification by the RF power amplifier, the distortion correction function being derived from a relationship between the matching input sample and the output signal; and
means for broadcasting the output signal across a medium.

41. A method for correcting signal distortion introduced by an RF power amplifier, comprising:
storing a plurality of samples representing at least a portion of an input signal, the input signal intended for amplification by the RF power amplifier;
receiving an output signal generated by the RF power amplifier;
determining, as a matching input sample, which of the stored plurality of samples corresponds most closely to the output signal; and
selectively applying a distortion correction function to the input signal prior to amplification by the RF power amplifier, the distortion correction function being derived from a relationship between the matching input sample and the output signal.

42. The method of claim 41, wherein
said receiving step includes realizing a sample of the output signal; and
wherein said determining step comprises correlating a characteristic for each of the stored plurality of samples against a similar characteristic of the realized sample of the output signal.

43. The method of claim 42, wherein the characteristic comprises a magnitude.

44. The method of claim 42, further comprising:
correcting a phase offset in the realized sample of the output signal relative to the matching input symbol; and
wherein said applying step comprises deriving the distortion correction function based on a relationship between the matching input sample and the phase offset corrected realized sample of the output signal.

45. The method of claim 44, further comprising providing sampling alteration information to selectively alter sampling of the output signal.

46. The method of claim 45, wherein said correlating step comprises:
generating a first correlation result for one of stored plurality of samples immediately preceding the matching input sample; and
generating a second correlation result for one of the stored plurality of samples immediately proceeding the matching input sample; and
wherein said providing step includes generating the sampling alteration information based on a relationship between the first and second correlation results.

47. The method of claim 42, further comprising providing sampling alteration information to selectively alter sampling of the output signal.

48. The method of claim 47, wherein
said correlating step comprises:
generating a first correlation result for one of stored plurality of samples immediately preceding the matching input sample in said buffer; and generating a second correlation result for one of the stored plurality of samples immediately proceeding the matching input sample in said buffer; and wherein said providing step includes generates the sampling alteration information based on a relationship between the first and second correlation results.

49. The method of claim 41, wherein said determining step comprises determining when a convergence condition has occurred with respect to determination of the matching input sample relative to said buffer.

50. A computer program product comprising computer readable program code causing an information processor to perform at least one of the following steps when executed, the steps comprising:

storing a plurality of samples representing at least a portion of an input signal, the input signal intended for amplification by the RF power amplifier;

receiving an output signal generated by the RF power amplifier;

determining, as a matching input sample, which of the stored plurality of samples corresponds most closely to the output signal; and selectively applying a distortion correction function to the input signal prior to amplification by the RF power amplifier, the distortion correction function being derived from a relationship between the matching input sample and the output signal.

51. The product of claim 50, wherein said receiving step includes realizing a sample of the output signal; and wherein said determining step comprises correlating a characteristic for each of the stored plurality of samples against a similar characteristic of the realized sample of the output signal.

52. The product of claim 51, wherein the characteristic comprises a magnitude.

53. The product of claim 51, wherein said computer readable program code further causes the information processor to perform the step of correcting a phase offset in the realized sample of the output signal relative to the matching input symbol; and wherein said applying step comprises deriving the distortion correction function based on a relationship between the matching input sample and the phase offset corrected realized sample of the output signal.

54. The product of claim 53, wherein said computer readable program code further causes the information processor to perform the step of providing sampling alteration information to selectively alter sampling of the output signal.

55. The product of claim 54, wherein said correlating step comprises:

generating a first correlation result for one of stored plurality of samples immediately preceding the matching input sample; and generating a second correlation result for one of the stored plurality of samples immediately proceeding the matching input sample; and wherein said providing step includes generating the sampling alteration information based on a relationship between the first and second correlation results.

56. The product of claim 51, wherein said computer readable program code further causes the information processor to perform the step of providing sampling alteration information to selectively alter sampling of the output signal.

57. The product of claim 56, wherein said correlating step comprises:

generating a first correlation result for one of stored plurality of samples immediately preceding the matching input sample in said buffer; and generating a second correlation result for one of the stored plurality of samples immediately proceeding the matching input sample in said buffer; and wherein said providing step includes generates the sampling alteration information based on a relationship between the first and second correlation results.

58. The product of claim 50, wherein said determining step comprises determining when a convergence condition has occurred with respect to determination of the matching input sample relative to said buffer.

* * * * *